US010262591B2

(12) United States Patent
Wang et al.

(10) Patent No.: US 10,262,591 B2
(45) Date of Patent: Apr. 16, 2019

(54) CIRCUIT FOR DRIVING AMOLE PIXEL

(71) Applicant: Shenzhen China Star Optoelectronics Technology Co., Ltd., Shenzhen (CN)

(72) Inventors: Limin Wang, Shenzhen (CN); Tai Jiun Hwang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 133 days.

(21) Appl. No.: 15/328,508

(22) PCT Filed: Jan. 10, 2017

(86) PCT No.: PCT/CN2017/070694
§ 371 (c)(1),
(2) Date: Jan. 24, 2017

(87) PCT Pub. No.: WO2018/036089
PCT Pub. Date: Mar. 1, 2018

(65) Prior Publication Data
US 2018/0204518 A1 Jul. 19, 2018

(30) Foreign Application Priority Data
Aug. 25, 2016 (CN) .......................... 2016 1 0719220

(51) Int. Cl.
*G09G 3/3258* (2016.01)
*G09G 3/3225* (2016.01)
(Continued)

(52) U.S. Cl.
CPC ......... *G09G 3/3258* (2013.01); *G09G 3/3225* (2013.01); *G09G 3/3266* (2013.01);
(Continued)

(58) Field of Classification Search
CPC .. G09G 3/3258; G09G 3/3291; G09G 3/3266; G09G 3/3225; G09G 2330/027;
(Continued)

(56) References Cited

U.S. PATENT DOCUMENTS 9,501,997 B2 11/2016 Huang
9,666,136 B2 5/2017 Xu
2002/0140645 A1 10/2002 Sato
(Continued)

FOREIGN PATENT DOCUMENTS

CN 101556778 A 10/2009
CN 103236234 A 8/2013
(Continued)

OTHER PUBLICATIONS

Chinese Office Action issued in related CN 2017062201597930 dated Jun. 27, 2017.
(Continued)

*Primary Examiner* — Abhishek Sarma
(74) *Attorney, Agent, or Firm* — Andrew C. Cheng

(57) ABSTRACT

A circuit for driving an AMOLED pixel is disclosed. The circuit includes: a first transistor, a second transistor, and a grayscale storage capacitor, wherein a connecting path is arranged between an input end of a data line and an input end of a scanning line, by which an afterimage is eliminated when an AMOLED display device is turned off in a predetermined turned-off sequence of external control signals and voltages on each portion of the circuit.

14 Claims, 4 Drawing Sheets

(51) Int. Cl.
    *H01L 27/32* (2006.01)
    *G09G 3/3266* (2016.01)
    *G09G 3/3291* (2016.01)

(52) U.S. Cl.
    CPC ....... *G09G 3/3291* (2013.01); *H01L 27/3265* (2013.01); *H01L 27/3276* (2013.01); *G09G 2300/0842* (2013.01); *G09G 2310/0248* (2013.01); *G09G 2330/027* (2013.01)

(58) Field of Classification Search
    CPC .... G09G 2310/0248; G09G 2300/0842; H01L 27/3265; H01L 27/3276
    See application file for complete search history.

(56) References Cited

U.S. PATENT DOCUMENTS

| | | | | |
|---|---|---|---|---|
| 2015/0206477 | A1* | 7/2015 | Xu | G09G 3/3233 345/206 |
| 2016/0275859 | A1* | 9/2016 | Tseng | G09G 3/3233 |
| 2018/0204618 | A1 | 7/2018 | Wang | |

FOREIGN PATENT DOCUMENTS

| | | |
|---|---|---|
| CN | 103400546 A | 11/2013 |
| CN | 203366703 U | 12/2013 |
| CN | 103943064 A | 7/2014 |
| CN | 104616615 A | 5/2016 |
| CN | 106097973 A | 11/2016 |

OTHER PUBLICATIONS

International Search Report and Written Opinion issued in related PCT/CN2017/070694 dated May 12, 2017.
Machine translation of CN101556778A by Lexis Nexis Total Patent dated Nov. 9, 2018 (pp. 26).
Machine translation of CN104616615A by Lexis Nexis Total Patent dated Nov. 9, 2018 (pp. 16).
Machine translation of CN203366703U by Lexis Nexis Total Patent dated Nov. 9, 2018 (pp. 19).
Machine translation of ISR issued in related PCT/CN2017/070694 dated May 12, 2017.

* cited by examiner

CIRCUIT FOR DRIVING AMOLE PIXEL

CROSS-REFERENCE TO RELATED APPLICATIONS

The present application claims priority of Chinese patent application CN201610719220.9, entitled "Circuit for Driving AMOLED Pixel" and filed on Aug. 25, 2016, the entirety of which is incorporated herein by reference.

FIELD OF THE INVENTION

The present disclosure relates to the technical field of organic display control, and particularly to a circuit for driving an AMOLED pixel.

BACKGROUND OF THE INVENTION

FIG. 1 shows a schematic diagram of a structure of a pixel driving circuit of a basic Active-matrix organic light emitting diode (AMOLED) display device in the prior art. The driving circuit has a 2T1C structure, wherein T1 is a switching transistor, T2 is a drive transistor, Cst is a storage capacitor, and OLED is an organic light emitting diode. When a scanning line G outputs a scanning signal and the transistor T1 is turned off, a grayscale data signal Vdata charges the storage capacitor Cst via T1. When the storage capacitor Cst is charged to a predetermined value, the transistor T2 is turned on, and a driving signal ELVDD lightens the OLED via T2.

After an AMOLED display device is turned off, a natural discharge process of the data voltage Vdata output by a source driving chip is slow, which affects a discharging speed of point A. Moreover, when the display device is turned off, a continuous and effective turn-on voltage cannot be ensured by a scanning driving chip, which causes that T1 is turned off before the data voltage Vdata at point A discharges completely. As a result, a discharge path for the voltage at point A is blocked, and thus a discharge process at point A is adversely affected. Therefore, after the display device is turned off, an afterimage is generated.

SUMMARY OF THE INVENTION

In order to solve the above problems, the present disclosure provides a circuit for driving an AMOLED pixel which can mitigate or even eliminate the shutdown afterimage of an AMOLED display device.

According to one embodiment of the present disclosure, a circuit for driving an AMOLED pixel is provided. The circuit comprises:

a first transistor, a source of which being connected to a data line, and a gate of which being connected to a scanning line;

a second transistor, a gate of which being connected to a drain of the first transistor, a source of which being connected to a driving signal line, and a drain of which being connected to an OLED;

a grayscale storage capacitor, one end of which being connected to the drain of the first transistor, and the other end being connected to the drain of the second transistor for storing a grayscale voltage, wherein a connecting path is arranged between an input end of the data line and an input end of the scanning line, by which an afterimage is eliminated when an AMOLED display device is turned off in a predetermined turned-off sequence of external control signals and voltages on each portion of the circuit.

According to one embodiment of the present disclosure, the connecting path comprises transistors side-attached to each data line and each scanning line, wherein, gates of all transistors on the connecting path are in parallel connection with one another and a first external control signal is input to the gates; sources of transistors side-attached to data lines are respectively connected to a corresponding data line, and drains thereof are connected to ground; and a second external control signal is input to sources of transistors side-attached to scanning lines, and drains thereof are respectively connected to a corresponding scanning line.

According to one embodiment of the present disclosure, the circuit further comprises a voltage comparator for generating the first external control signal based on a gamma voltage when a display device is turned off and a data driving voltage.

According to one embodiment of the present disclosure, the second external control signal is a scanning signal high voltage.

According to one embodiment of the present disclosure, the gamma voltage is any gamma voltage value in a set of gamma voltages which is higher than the data driving voltage.

According to one embodiment of the present disclosure, the gamma voltage is a largest gamma voltage value in a set of gamma voltages.

According to one embodiment of the present disclosure, the circuit further comprises a shutdown timing controller for enabling the voltages on each portion of the circuit to be turned off according to a predetermined sequence.

According to one embodiment of the present disclosure, the shutdown timing controller turns off each voltage according to a following sequence: the gamma voltage, a chip operating voltage, the scanning signal high voltage, a scanning signal low voltage and the data driving voltage.

According to one embodiment of the present disclosure, the transistors side-attached to each data line are integrated into a source driving chip, and the transistors side-attached to each scanning line are integrated into a gate driving chip.

According to one embodiment of the present disclosure, the voltage comparator is integrated into the source driving chip or the gate driving chip.

The following beneficial effects can be brought about according to the present disclosure.

According to the present disclosure, a connecting path is arranged between the input end of the data line and the input end of the scanning line, whereby the shutdown afterimage of an AMOLED display device can be mitigated or even eliminated. Moreover, the connecting path can be arranged in the source driving chip or the gate driving chip, and thus an aperture ratio of the pixels is not affected. The design of the circuit is simple and is easy to be realized.

Other advantages, objects, and features of the present disclosure will be explained in the following description to some extent, and partly become self-evident therefrom, or be understood through implementation of the present disclosure. The objectives and other advantages of the present disclosure will be achieved and obtained through the structure specifically pointed out in the description, claims, and the accompanying drawings.

BRIEF DESCRIPTION OF THE DRAWINGS

The drawings are provided for further understanding of the technical solutions of the present application or the prior art, and constitute one part of the description. The drawings are used for interpreting the present disclosure together with the embodiments, not for limiting the present disclosure. In the drawings:

FIG. 4b is an equivalent circuit diagram of FIG. 4a;

FIG. 5b is an equivalent circuit diagram of FIG. 5a.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

Figure 2:
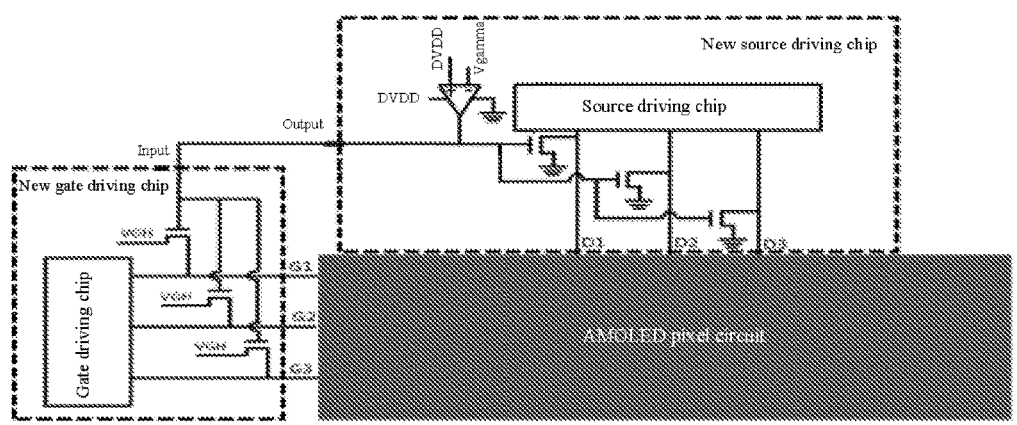
FIG. 2 is a structural diagram of a pixel driving circuit in an AMOLED display device according to one embodiment of the present disclosure.

In order to eliminate the shutdown afterimage of an AMOLED display device, the present disclosure provides a circuit for driving an AMOLED pixel. FIG. 2 shows a schematic diagram of the structure of a pixel driving circuit of the AMOLED display device according to one embodiment of the present disclosure. The present disclosure will be described in detail below with reference to FIG. 2.

Figure 3:
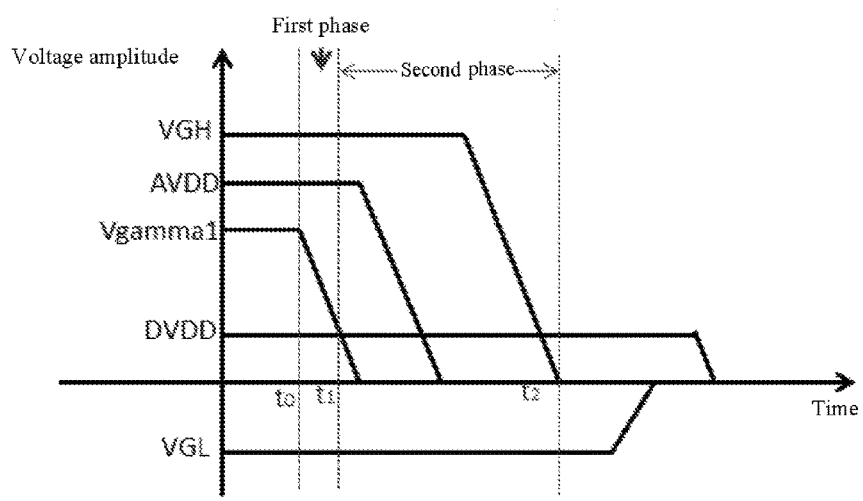
FIG. 3 schematically shows a voltage turn-off sequence of the AMOLED display device according to one embodiment of the present disclosure.

In general, in an AMOLED driving system, strict requirements are often imposed on the turn-on and turn-off sequences of the voltages on each portion of a display device in order to protect a source driving chip and a gate driving chip. In order to achieve the purpose of the present disclosure, i.e., to eliminate the shutdown afterimage of a display device, a shutdown voltage timing controller is arranged in the pixel driving circuit of the present disclosure, for controlling the voltage turned-off sequence on each portion of the driving circuit when the display device needs to be turned off. Specifically, the powering off sequence of each portion of the AMOLED display device is set successively as: Vgamma→AVDD→VGH→VGL→DVDD, as shown in FIG. 3. Vgamma represents a gamma voltage, which is a parameter of a display device; AVDD represents an operating voltage of the chip; VGH represents a scanning signal high voltage (the voltage on the scanning line when a scanning signal is output); VGL represents a scanning signal low voltage (the voltage on the scanning line when no scanning signal is output); and DVDD represents a data driving voltage. Moreover, in order to facilitate the control on shutdown afterimage of the display device, according to the present disclosure, Vgamma can be set to any gamma voltage value of a set of gamma voltages which is higher than DVDD. This is because that the magnitude relationship between the gamma voltage and DVDD is needed to serve as a critical point for determining whether to the display device is turned off. A gamma voltage value that is equal to or less than DVDD cannot be selected. Otherwise, the determination of the critical value cannot be achieved. Preferably, Vgamma can be selected to be a largest gamma voltage value in a set of gamma voltages, which is referred to as Vgamma1. The present disclosure will be illustrated below taking Vgamma1 as an example.

Figure 1:
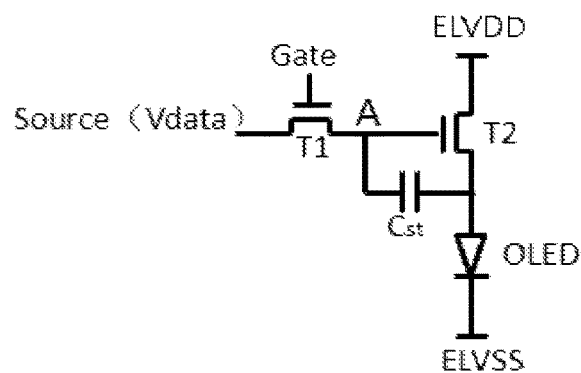
FIG. 1 is a structural diagram of a pixel driving circuit in an AMOLED display device in the prior art.

According to the present disclosure, the circuit for driving the AMOLED pixel comprises a first transistor T1, a second transistor T2 and a grayscale storage capacitor Cst. A source of the first transistor T1 is connected to a data line, and a gate thereof is connected to a scanning line. A gate of the second transistor T2 is connected to a drain of the first transistor T1; a source thereof is connected to a driving signal line ELVDD; and a drain thereof is connected to an OLED. One end of the grayscale storage capacitor Cst is connected to the drain of the first transistor T1, and the other end thereof is connected to the drain of the second transistor T2 for storing a grayscale voltage. Moreover, a connecting path is arranged between an input end of the data line and an input end of the scanning line, by which an afterimage is eliminated when an AMOLED display device is turned off in a predetermined turned-off sequence of external control signals and voltages on each portion of the circuit. A connection relationship among the first transistor T1, the second transistor T2, and the grayscale storage capacitor Cst is the same as that as shown in FIG. 1.

As shown in FIG. 2, according to the present disclosure, by arranging the connecting path between the data line and the scanning line, in the predetermined turned-off sequence of the external control signals and the voltages on each portion of the circuit, the charges remained at a connection point (i.e., the grayscale storage capacitor Cst) of the first transistor T1 and the second transistor T2 can be discharged through the connecting path, thereby eliminating the shutdown afterimage of the AMOLED display device.

According to one embodiment of the present disclosure, the connecting path comprises transistors side-attached to each data line and each scanning line, wherein, gates of all transistors on the connecting path are in parallel connection with one another and a first external control signal is input to the gates; sources of transistors side-attached to data lines are respectively connected to a corresponding data line, and drains thereof are connected to ground; and a second external control signal is input to sources of transistors side-attached to scanning lines, and drains thereof are respectively connected to a corresponding scanning line. Specifically, as shown in FIG. 2, the gates of all transistors on the connecting path are connected in parallel with one another, and a second external control signal is input to the sources of the transistors side-attached to the scanning lines. The second external control signal is a scanning signal high voltage VGH. Through the connecting path, the charges remained in the grayscale storage capacitor Cst when the display device is turned off are conducted into the drains of the transistors side-attached to the data lines, and then the excess charges are transmitted to the ground.

According to one embodiment of the present disclosure, the circuit further comprises a voltage comparator for generating the first external control signal based on a gamma voltage and a data driving voltage. Specifically, as shown in FIG. 2, the voltage comparator utilizes the data driving voltage DVDD as its operating voltage, and outputs a high level signal or a low level signal according to the magnitude relationship between the gamma voltage and the data driving voltage. The high level signal serves as the first external control signal. The first external control signal turns on the transistors side-attached to each data line and each scanning line, and the second external control signal turns on the corresponding first transistor T1 through the transistors side-attached to each scanning line, thereby directing the charges remained at the connection point of the first transistor T1 and the second transistor T2 into the ground.

According to one embodiment of the present disclosure, the second external control signal is a scanning signal high voltage VGH. The second external control signal can turn on the corresponding first transistor T1 through the transistors side-attached to each scanning line.

According to one embodiment of the present disclosure, the transistors side-attached to each data line are integrated into a source driving chip, and the transistors side-attached to each scanning line are integrated into a gate driving chip. Specifically, as shown in FIG. 2, the transistors side-attached to each data line can be integrated into the source driving chip so as to form a new source driving chip. The transistors side-attached to each scanning line can be integrated into the gate driving chip so as to form a new gate driving chip.

According to one embodiment of the present disclosure, the voltage comparator is integrated into the source driving chip or the gate driving chip. Specifically, as shown in FIG. 2, the voltage comparator is integrated into the source driving chip.

Figure 4A:
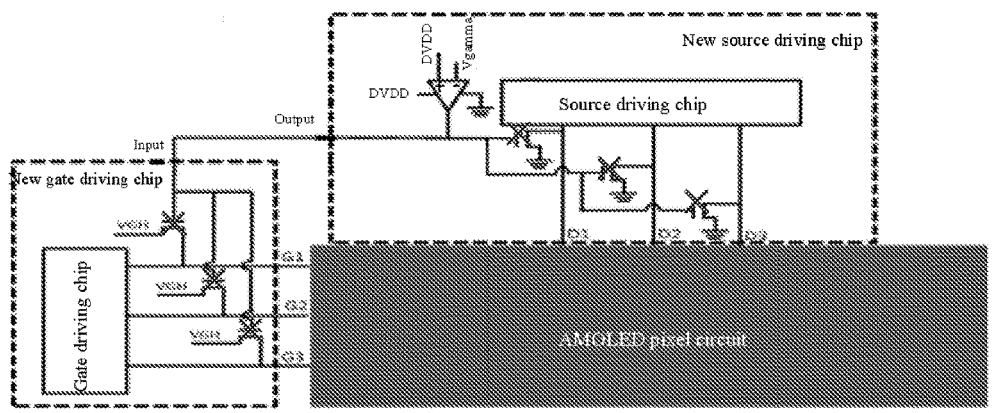
FIG. 4a is schematic diagram illustrating the operation of the circuit as shown in FIG. 2 during the period between t0 and t1 as shown in FIG. 3.
Figure 4B:
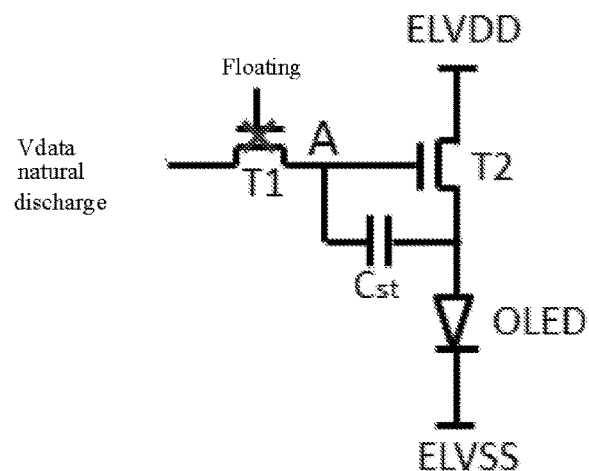

When the circuit is operating, in particular, it comprises two processes: natural discharge phase and forced discharge phase. Specifically, the natural discharge phase corresponds to a period t0-t1 in FIG. 3, during which the display device is turned off just now. As shown in FIG. 3, t0 indicates a turning-off act, and t1 indicates a time point when Vgamma1 drops to DVDD. During the time period t0-t1, Vgamma1 is still higher than DVDD, the operation condition of the circuit is the same as that before the display device is turned off. At that time, the voltage comparator outputs a low-level signal L, and the transistors side-attached to each data line and each scanning line all remain in a turned-off state. The source driving chip and the gate driving chip are in common operating mode, and the operation conditions of each transistor of the circuit are shown in FIG. 4a. FIG. 4b is an equivalent circuit diagram of FIG. 4a. At that time, due to the absence of control signals, the voltage output by the gate driving chip floats, and the output voltage of the source driving chip begins to discharge naturally.

Figure 5A:
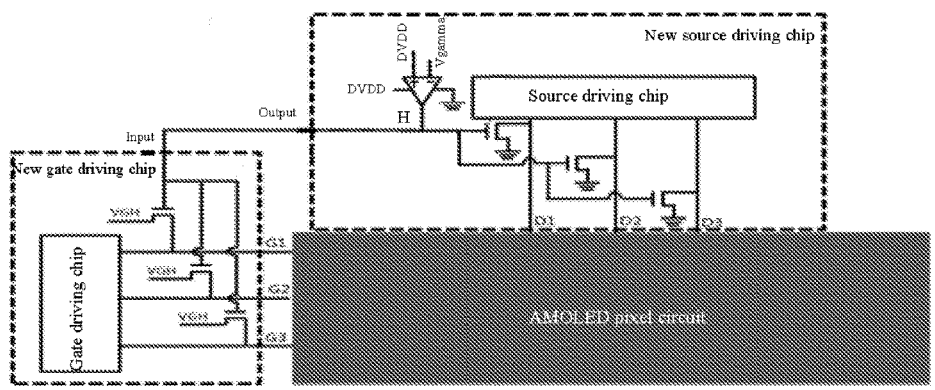
FIG. 5a is schematic diagram illustrating the operation of the circuit as shown in FIG. 2 during the period between t1 and t2 as shown in FIG. 3.
Figure 5B:
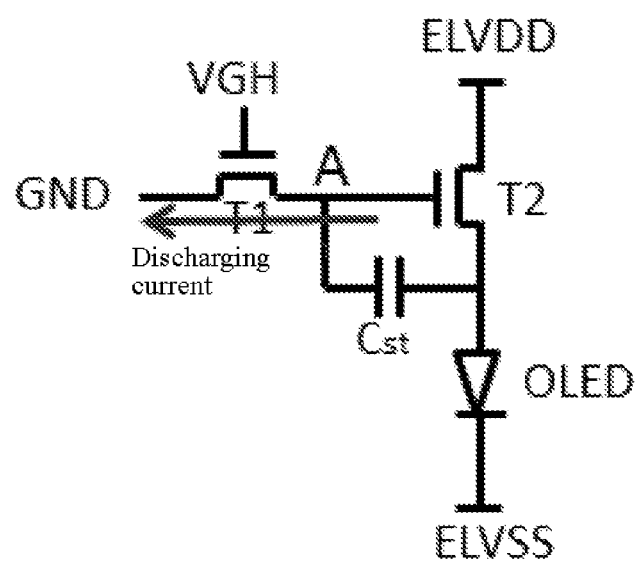

The forced discharge phase corresponds to a time period t1-t2 in FIG. 3, and t2 indicates a time point when VGH drops to zero. During the time period t1-t2, Vgamma1 is less than DVDD, and this period corresponds to an afterimage eliminating procedure. At this time, the voltage comparator outputs a high-level signal H, and the transistors in the connecting path are all turned on. All scanning lines output VGH signals, and the first transistor T1 is turned on. The operation conditions of each transistor of the circuit are shown in FIG. 5a, and FIG. 5b is an equivalent circuit diagram of FIG. 5a. At the same time, the source output signals to which all the first transistors T1 correspond are forced to be changed into GND signals, so that it can be ensured that the pixel voltage at the connection point of the first transistor T1 and the second transistor T2 obtains a discharge path. Through the adjustment to the turned off time of each voltage by the shutdown timing controller, a time interval between t1 and t2 is increased. In this manner, the acting time of the shutdown afterimage eliminating phase can be extended, and the afterimage eliminating effect can be optimized.

According to the present disclosure, a connecting path is arranged between the input end of the data line and the input end of the scanning line, whereby the shutdown afterimage of an AMOLED display device can be mitigated or even eliminated. Moreover, the connecting path can be arranged in the source driving chip or the gate driving chip, and thus an aperture ratio of the pixels is not affected. The design of the circuit is simple and is easy to be realized.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A circuit for driving an AMOLED pixel, comprising:
a first transistor, a source of which being connected to a data line, and a gate of which being connected to a scanning line;
a second transistor, a gate of which being connected to a drain of the first transistor, a source of which being connected to a driving signal line, and a drain of which being connected to an OLED;
a grayscale storage capacitor, one end of which being connected to the drain of the first transistor, and the other end being connected to the drain of the second transistor for storing a grayscale voltage,
wherein a connecting path is arranged between an input end of the data line and an input end of the scanning line, by which an afterimage is eliminated when an AMOLED display device is turned off in a predetermined turned-off sequence of external control signals and voltages on each portion of the circuit;
wherein the connecting path comprises transistors side-attached to each data line and each scanning line, wherein,
gates of all transistors on the connecting path are in parallel connection with one another and a first external control signal is input to the gates;
sources of transistors side-attached to data lines are respectively connected to a corresponding data line, and drains thereof are connected to ground; and
a second external control signal is input to sources of transistors side-attached to scanning lines, and drains thereof are respectively connected to a corresponding scanning line.

2. The circuit according to claim 1, wherein the circuit further comprises a voltage comparator for generating the first external control signal based on a gamma voltage when a display device is turned off and a data driving voltage.

3. The circuit according to claim 1, wherein the second external control signal is a scanning signal high voltage.

4. The circuit according to claim 2, wherein the second external control signal is a scanning signal high voltage.

5. The circuit according to claim 2, wherein the gamma voltage is any gamma voltage value in a set of gamma voltages which is higher than the data driving voltage.

6. The circuit according to claim 3, wherein the gamma voltage is any gamma voltage value in a set of gamma voltages which is higher than the data driving voltage.

7. The circuit according to claim 4, wherein the gamma voltage is any gamma voltage value in a set of gamma voltages which is higher than the data driving voltage.

8. The circuit according to claim 5, wherein the gamma voltage is a largest gamma voltage value in a set of gamma voltages.

9. The circuit according to claim 6, wherein the gamma voltage is a largest gamma voltage value in a set of gamma voltages.

10. The circuit according to claim 7, wherein the gamma voltage is a largest gamma voltage value in a set of gamma voltages.

11. The circuit according to claim 1, wherein the circuit further comprises a shutdown timing controller for enabling the voltages on each portion of the circuit to be turned off according to a predetermined sequence.

12. The circuit according to claim 11, wherein the shutdown timing controller turns off each voltage according to a following sequence: a gamma voltage, a chip operating voltage, a scanning signal high voltage, a scanning signal low voltage and a data driving voltage.

13. The circuit according to claim 1, wherein the transistors side-attached to each data line are integrated into a source driving chip, and the transistors side-attached to each scanning line are integrated into a gate driving chip.

14. The circuit according to claim 2, wherein the voltage comparator is integrated into the source driving chip or the gate driving chip.

* * * * *